US010132848B2

(12) United States Patent
Kure et al.

(10) Patent No.: US 10,132,848 B2
(45) Date of Patent: Nov. 20, 2018

(54) SYSTEM AND METHOD FOR TUNING TRANSFORMERS

(71) Applicant: The United States of America, as represented by the Secretary of the Navy, Washington, DC (US)

(72) Inventors: Josue Kure, Bloomington, IN (US); Timothy Gomez, Bloomington, IN (US); Patrick Arvin, Loogootee, IN (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/944,712

(22) Filed: Apr. 3, 2018

(65) Prior Publication Data

US 2018/0224491 A1    Aug. 9, 2018

Related U.S. Application Data

(62) Division of application No. 14/675,541, filed on Mar. 31, 2015, now Pat. No. 10,060,962.

(60) Provisional application No. 61/972,701, filed on Mar. 31, 2014.

(51) Int. Cl.
| | | |
|---|---|---|
| *H01F 27/28* | (2006.01) | |
| *G01R 29/20* | (2006.01) | |
| *G01R 23/00* | (2006.01) | |
| *G01R 31/02* | (2006.01) | |
| *H01F 38/28* | (2006.01) | |
| *H01F 21/12* | (2006.01) | |
| *H01F 27/42* | (2006.01) | |
| *G01R 27/02* | (2006.01) | |
| *H01F 29/14* | (2006.01) | |
| *G01R 35/02* | (2006.01) | |

(52) U.S. Cl.
CPC ............. *G01R 29/20* (2013.01); *G01R 23/00* (2013.01); *G01R 27/02* (2013.01); *G01R 31/027* (2013.01); *H01F 21/12* (2013.01); *H01F 27/42* (2013.01); *H01F 38/28* (2013.01); *G01R 35/02* (2013.01); *H01F 2029/143* (2013.01)

(58) Field of Classification Search
CPC ...... G01R 29/20; G01R 23/00; G01R 31/027; H01F 38/28; H01F 2029/143; H01F 21/12; H01F 27/42
See application file for complete search history.

(56) References Cited

U.S. PATENT DOCUMENTS

| | | | | |
|---|---|---|---|---|
| 4,817,011 A | * | 3/1989 | Davis ................... | G01R 31/027 324/76.51 |
| 6,054,858 A | * | 4/2000 | Dumoulin .......... | G01R 33/3628 324/314 |
| 2002/0113679 A1 | * | 8/2002 | Takayama ........... | H01F 27/2847 336/65 |

* cited by examiner

*Primary Examiner* — Mohamed Charioui
*Assistant Examiner* — Christine Liao
(74) *Attorney, Agent, or Firm* — Christopher A. Monsey

(57) ABSTRACT

A system and method for tuning a transformer is provided. A transformer fixture may connect a switching network to a plurality of inductors of a transformer. At least one computing device may calculate a target number of turns for a primary coil and a secondary coil of the transformer based on a frequency response of the transformer. The switching network may connect the inductors of the transformer together in a pattern that results in the primary coil and secondary coil having the target number of turns.

6 Claims, 12 Drawing Sheets

SYSTEM AND METHOD FOR TUNING TRANSFORMERS

CROSS-REFERENCE TO RELATED APPLICATIONS

This patent application is a divisional, which claims the benefit of U.S. Non-Provisional application Ser. No. 14/675,541, titled SYSTEM AND METHOD FOR TUNING TRANSFORMERS, filed on Mar. 31, 2015, which also claims the benefit of U.S. Provisional Application No. 61/972,701, titled SYSTEM AND METHOD FOR TUNING TRANSFORMERS, filed Mar. 31, 2014, the disclosure of which is expressly incorporated by reference herein.

STATEMENT REGARDING FEDERALLY SPONSORED RESEARCH OR DEVELOPMENT

The invention described herein includes contributions by one or more employees of the Department of the Navy made in performance of official duties and may be manufactured, used and licensed by or for the United States Government for any governmental purpose without payment of any royalties thereon. This invention (NC 103,111) is assigned to the United States Government and is available for licensing for commercial purposes. Licensing and technical inquiries may be directed to the Technology Transfer Office, Naval Surface Warfare Center Crane, email: Cran_CTO@navy.mil.

FIELD OF THE DISCLOSURE

The present disclosure generally relates to a system and method for tuning transformers, and more particularly to a system and method for tuning a transformer of a transducer such as a Tonpilz transducer.

BACKGROUND OF THE DISCLOSURE

A transformer includes a primary winding and a secondary winding each comprised of one or more inductors. In some systems, the number of turns of the primary and secondary windings of the transformer may be adjusted to tune the transformer. A known method of tuning a transformer involves a test technician using alligator clipped wires to manually connect inductors in the transformer together to vary the number of turns of corresponding windings. The test technician uses a trial and error approach by changing the connections of the clips and measuring the impedance and frequency of the transformer until a target frequency response is achieved. Manually connecting clips to adjust the number of turns of the coils sometimes results in short circuits between the clips and inductors. Further, such a trial and error approach to transformer tuning is time consuming and inefficient. In some environments, the clips are manually connected to the inductors above eye level while the test technician is sitting or below eye level while the test technician is standing. This ergonomic difficulty results in discomfort to the test technician as more units are tested.

SUMMARY OF EMBODIMENTS OF THE DISCLOSURE

A transformer fixture is provided that connects a switching network to transformer inductors. An impedance analyzer performs a frequency sweep of the transformer. Computer logic controls the switching network to automatically vary the connection pattern of the inductors to achieve a proper frequency and/or impedance response of the transformer.

In an exemplary embodiment of the present disclosure, a method for tuning a transformer is provided. The method includes affixing a transformer fixture to a transformer. The transformer includes a plurality of inductors and a plurality of terminals. The transformer fixture includes a plurality of electrical connectors configured to make electrical contact with the plurality of inductors during the affixing. The method includes providing a switching network, and the switching network includes a plurality of switches coupled to the plurality of electrical connectors of the transformer fixture. The switching network is operative to connect at least one first inductor of the plurality of inductors to a first terminal of the transformer to form a primary coil of the transformer. The switching network is operative to connect at least one second inductor of the plurality of inductors to a second terminal of the transformer to form a secondary coil of the transformer. The method further includes providing an impedance analyzer in electrical communication with the transformer. The impedance analyzer is operative to execute a frequency sweep of the transformer and to determine a frequency response of the transformer based on the frequency sweep. The method further includes executing a computer program on at least one computing device. The at least one computing device when executing the computer program is operative to calculate a target number of turns of at least one of the primary coil and the secondary coil of the transformer based on the frequency response of the transformer. The at least one computing device is operative to control the switching network to adjust the plurality of switches to connect at least a portion of the plurality of inductors of the transformer to at least one terminal of the transformer to configure the at least one of the primary coil and the secondary coil with the target number of turns.

In another exemplary embodiment of the present disclosure, a method for tuning a transformer is provided. The method includes instructing, by at least one computing device, an impedance analyzer to execute a frequency sweep of a transformer. The transformer includes a first coil and a second coil. The method includes determining, by the at least one computing device, a frequency value corresponding to a maximum impedance of the transformer observed during the frequency sweep. The method includes, in response to the frequency value being outside of a threshold frequency range, instructing, by the at least one computing device, a switching network coupled to the transformer to adjust a number of turns of the first coil of the transformer. The switching network is coupled to a fixture coupled to the transformer. The method includes determining, by the at least one computing device, an impedance value of the transformer corresponding to a predetermined frequency. The method includes, in response to the impedance value being outside of a threshold impedance range, instructing, by the at least one computing device, the switching network to adjust a number of turns of the second coil of the transformer.

In yet another exemplary embodiment of the present disclosure, a transformer tuning system is provided. The system includes a fixture removably coupled to a transformer. The fixture includes a plurality of electrical connectors configured to engage a plurality of inductors of the transformer when the fixture is coupled to the transformer. The system includes an impedance analyzer in communication with the transformer. The impedance analyzer is operative to execute a frequency sweep of the transformer and to monitor a frequency response of the transformer based on the frequency sweep. The system further includes a switching network coupled to the fixture and including a plurality of electrical switches in electrical communication with the plurality of electrical connectors of the fixture. The switching network is operative to selectively open and close the plurality of electrical switches to selectively connect at least one inductor of the plurality of inductors of the transformer to at least one terminal of the transformer. The system further includes at least one computing device in communication with the impedance analyzer and the switching network. The at least one computing device is operative to determine at least one of a frequency value and an impedance value of the transformer following the frequency sweep. The frequency value corresponds to a maximum impedance of the transformer observed during the frequency sweep, and the impedance value corresponds to a predetermined frequency applied to the transformer. The at least one computing device is further operative to instruct the switching network to adjust a number of turns of at least one of a first coil and a second coil of the transformer based on the at least one of the frequency value and the impedance value of the transformer.

In still another exemplary embodiment of the present disclosure, a non-transitory computer-readable medium includes executable instructions such that when executed by at least one processor cause the at least one processor to instruct an impedance analyzer to execute a frequency sweep of a transformer, determine a frequency value corresponding to a maximum impedance of the transformer observed during the frequency sweep, instruct a switching network coupled to the transformer to adjust a number of turns of a first coil of the transformer in response to the frequency value being outside of a threshold frequency range, determine an impedance value of the transformer corresponding to a predetermined frequency, and instruct the switching network to adjust a number of turns of a second coil of the transformer in response to the impedance value being outside of a threshold impedance range.

BRIEF DESCRIPTION OF THE DRAWINGS

The embodiments will be more readily understood in view of the following description when accompanied by the below figures and wherein like reference numerals represent like elements.

DETAILED DESCRIPTION OF THE DRAWINGS

Figure 1:
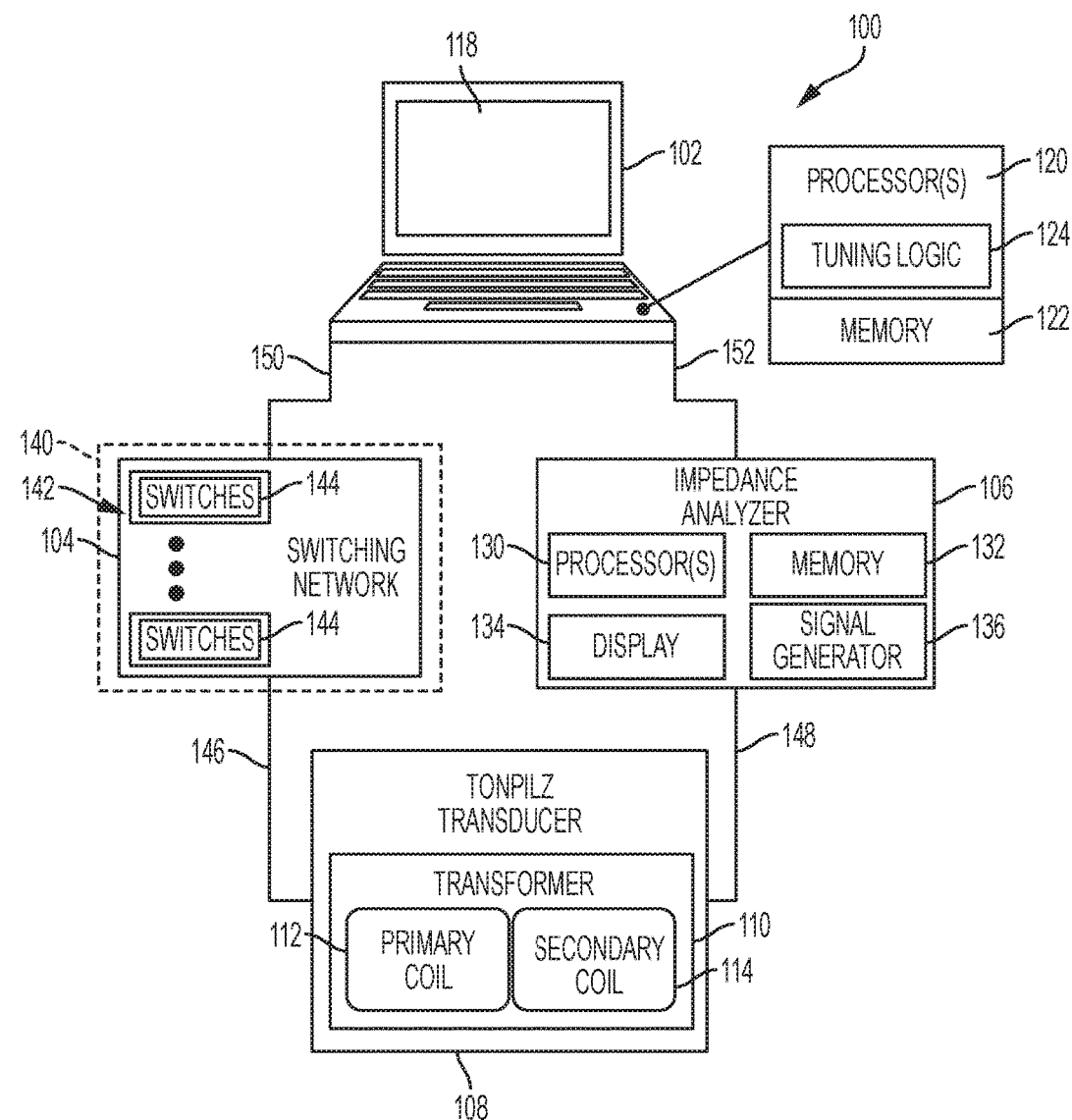
FIG. 1 illustrates a block diagram of a system for tuning a transformer in accordance with an exemplary embodiment of the present disclosure.

Referring initially to FIG. 1, a system 100 for testing and tuning a transformer according to an exemplary embodiment is illustrated. System 100 includes a computing device 102, a switching network 104, an impedance analyzer 106, and a transformer 110. Transformer 110 includes at least one primary coil 112 and at least one secondary coil 114 each including a plurality of inductors. As described herein, the number of turns of each coil 112, 114 is adjustable with switching network 104 by adjusting the connection pattern of the inductors of each coil 112, 114, as described herein. System 100 may be used to tune any suitable transformer to a desired impedance and frequency response. In the illustrated embodiment, transformer 110 is a component of a transducer 108, illustratively a Tonpilz transducer 108. System 100 may also be used to tune a transformer that is not a part of a transducer 108.

Computing device 102 is in communication with switching network 104 and impedance analyzer 106 via respective communication wires or cables 150, 152. Impedance analyzer 106 is in electrical communication with transducer 108 via a communication cable or wires 148. In the illustrated embodiment, switching network 104 is supported by a fixture 140 that mounts to transformer 110, and switching network 104 is in electrical communication with transformer 110 via one or more connectors 146, as described herein with respect to FIGS. 4 and 5. Computing device 102 includes a display 118, one or more processors 120, and memory 122 containing instructions such that when executed by the one or more processors 120 causes the processor(s) 120 to perform the functions described herein. Processor(s) 120 illustratively includes transformer tuning logic 124 operative to initiate, manage, and monitor the transformer tuning procedure described herein. In the illustrated embodiment, computing device 102 is a laptop or a desktop computer or any other suitable computing device or system.

In one embodiment, impedance analyzer 106 is a computing device or computing apparatus externally coupled to computing device 102 via communication cables 152. Impedance analyzer 106 includes at least one processor 130 that executes instructions stored in internal or external memory 132 for performing the impedance analyzer functionality described herein. Impedance analyzer 106 includes a signal generator 136 controlled by processor 130 for generating a voltage or current signal provided to transducer 108 at various frequencies during execution of the frequency sweep of transformer 110. Impedance analyzer 106 further includes a display 134 for displaying feedback and status information to a user. In one embodiment, impedance analyzer 106 is an Agilent® RF Network/Spectrum/Impedance Analyzer provided by Agilent Technologies, Inc. headquartered in Santa Clara, Calif., although another suitable impedance analyzer may be provided. In another embodiment, impedance analyzer 106 includes logic contained internal to computing device 102.

In the illustrated embodiment, primary and secondary coils 112 and 114 of transformer 110 are formed based on the connection pattern of the plurality of inductors of coils 112 and 114. The inductors of each coil 112, 114 have different numbers of turns. Depending on the connection pattern of the inductors, the number of turns on each coil 112, 114 may be varied via switching network 104. Switching network 104 controls the connection pattern by selectively closing and opening electronic switches 144 that connect particular inductors based on commands from computing device 102, as described herein.

Computing device 102 executes a computer program stored in memory 122 to run the transformer tuning procedure. In an exemplary operation of the tuning procedure, computing device 102 directs impedance analyzer 106 to perform a frequency sweep on transformer 110, such as a sweep frequency response analysis (SFRA) of transformer 110. The frequency sweep includes impedance analyzer 106 generating a test signal with signal generator 136 at a range of frequencies and providing the signal to transformer 110 across the frequency range while monitoring the input impedance of transformer 110 at each frequency. In one embodiment, the signal is a low voltage signal, such as a 1 volt signal, for example. Impedance analyzer 106 collects and stores data representing the resulting frequency response of transformer 110 including the tested frequency values and corresponding impedance values.

Computing device 102 obtains from impedance analyzer 106 the resulting impedance values of transformer 110 as a function of frequency. Computing device 102 analyzes the data and determines the frequency at which the observed maximum impedance of transformer 110 is achieved. If this frequency value is not approximately equal to a predetermined desired frequency value (or within a predetermined frequency range), then computing device 102 instructs switching network 104 to adjust the number of turns on primary coil 112. In particular, computing device 102 calculates a new target number of turns for primary coil 112 (see FIG. 8) based on the detected frequency value and the desired frequency value or range. Computing device 102 then determines which inductors should be connected to achieve the target number of turns. Computing device 102 communicates commands and/or connection pattern data to switching network 104 identifying which inductors of transformer 110 to connect together, and switching network 104 closes and opens appropriate switches 144 to achieve the connection pattern that results in the target new number of turns on primary coil 112.

In one embodiment, computing device 102 instructs impedance analyzer 106 to provide the test signal again to transformer 110 having the new connection pattern of primary coil 112. The test signal is applied at least at a predetermined frequency value, and in some embodiments the test signal may be applied across the full range of frequencies of the frequency sweep. Based on the results from impedance analyzer 106, computing device 102 determines the impedance of transformer 110 that results when the signal is applied at the predetermined frequency value. In one embodiment, the predetermined frequency value used following the primary coil adjustment is the same as the predetermined frequency value used to determine the maximum impedance value prior to the primary coil adjustment. In one embodiment, the predetermined frequency is 3 kilohertz (kHz) although any suitable predetermined frequency may be used. If the impedance of transformer 110 at the predetermined frequency falls outside a predetermined desired impedance range, then the number of turns on secondary coil 114 is adjusted. In one embodiment, the desired impedance range for the predetermined frequency is 62-70 ohms, although any suitable target impedance value or range may be used. Computing device 102 calculates a new target number of turns for secondary coil 114 based on the measured impedance and the desired impedance for that frequency (see FIG. 9). Computing device 102 then determines which inductors should be connected to achieve the target number of turns. Computing device 102 communicates commands and/or connection pattern data to switching network 104, and switching network 104 closes and opens the appropriate switches to achieve the connection pattern that results in the target number of turns on secondary coil 114.

In one embodiment, switching network 104 of FIG. 1 includes a plurality of removable switching cards 142 each including a plurality of switches 144. In one embodiment, each card 142 includes a circuit board and a plurality of electrical switches mounted to the circuit board. In the illustrated embodiment, the circuit boards of cards 142 are wired according to the switching matrix 600 of FIG. 6, as described herein. The switching cards 142 are coupled to fixture 140 to provide the switching network 104. In one embodiment, computing device 102 controls switching network 104 to selectively open or close each switch 144 by communicating data or control signals to switching network 104. Exemplary cards 142 include Model 7052 4X5 Matrix Switch Cards provided by Keithley Instruments, Inc. headquartered in Solon, Ohio, although other suitable switching cards 142 may be provided. In one embodiment, switches 144 include 3-pole Form A contacts.

Figure 2:
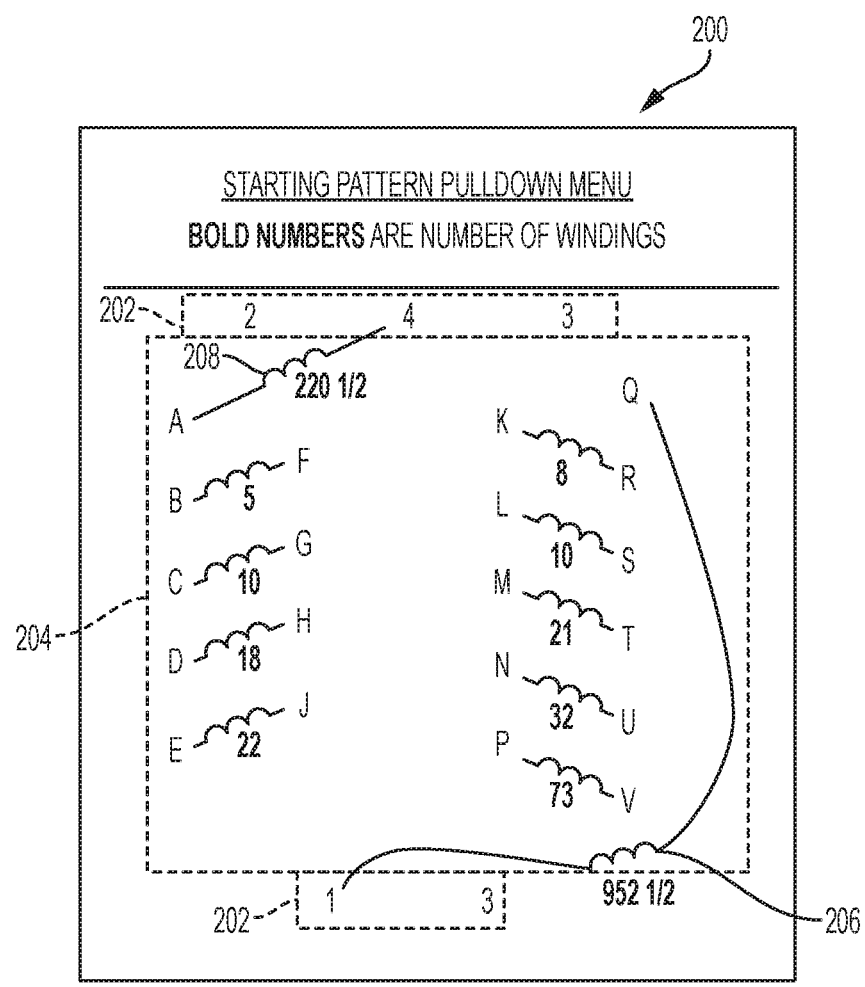
FIG. 2 illustrates a diagram of a plurality of terminals and a plurality of inductors of the transformer of FIG. 1 according to an exemplary embodiment of the present disclosure.

Referring to FIG. 2, an exemplary diagram 200 of an inductor and terminal layout of transformer 110 of FIG. 1 is illustrated. As illustrated with diagram 200, in one embodiment transformer 110 includes four terminals 202 (labeled 1 through 4) and eleven inductors 204, although fewer or additional terminals and inductors may be used. Inductors 204 are connected to corresponding inductor terminals A through V. When fixture 140 of FIG. 1 is affixed to transformer 110, inductor terminals A through V and transformer terminals 202 are connected to switches 144 of switching network 104 (FIG. 1). Primary coil 112 and secondary coil 114 of transformer 110 (FIG. 1) are formed when switching network 104 selectively connects inductor terminals together to form a number of turns of each coil 112, 114. In the illustrated embodiment, transformer 110 of FIG. 1 is a step-up transformer with primary coil 112 formed by one or more inductors 204 of terminals A-J and secondary coil 114 formed by one or more inductors 204 of terminals K-V. Other suitable transformer configurations may be provided.

In the illustrated embodiment, a first inductor 206 is connected at one end to a transformer terminal 202 (terminal 1) and at the other end to inductor terminal Q. Similarly, a second inductor 208 is connected at one end to another transformer terminal 202 (terminal 4) and at the other end to inductor terminal A. The exemplary number of turns of each inductor 204 is shown below each inductor 204 in FIG. 2. In the illustrated embodiment, the inductor A-4 (inductor 208) includes 220.5 turns, inductor B-F includes 5 turns, inductor C-G includes 10 turns, inductor D-H includes 18 turns, inductor E-J includes 22 turns, inductor K-R includes 8 turns, inductor L-S includes 10 turns, inductor M-T includes 21 turns, inductor N-U includes 32 turns, inductor P-V includes 73 turns, and inductor 1-Q (inductor 206) includes 952.5 turns. Other suitable configurations and numbers of inductors 204 may be provided.

In another embodiment, first inductor 206 and second inductor 208 are not directly connected to transformer terminals 202, but rather are connected to additional inductor terminals which are connected to switches of switching network 104. In this embodiment, switching network 104 provides electrical connections between terminals 202 and the switches connected to inductors 206, 208. In one embodiment, computing device 102 provides diagram 200 for display on display 118 (FIG. 1).

Figure 3:
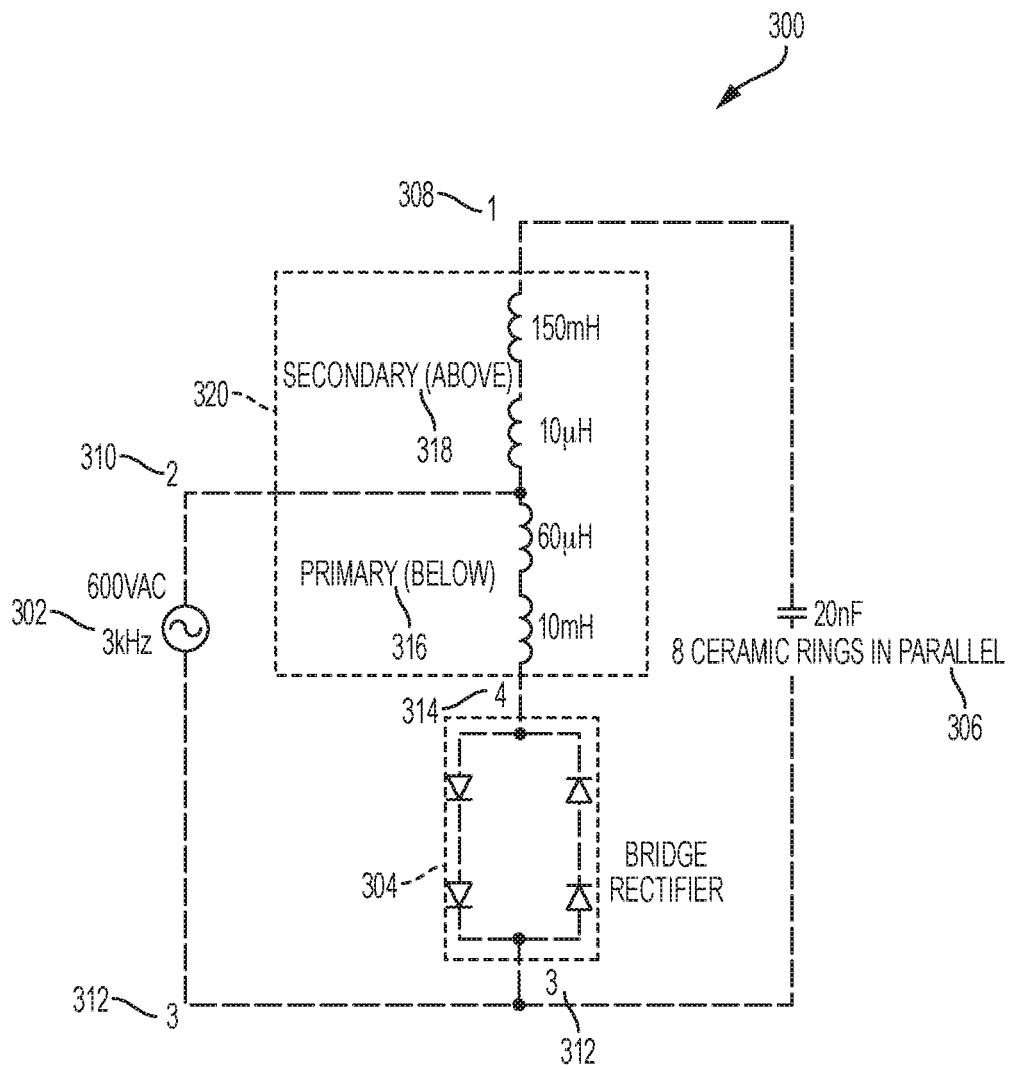
FIG. 3 illustrates a schematic of a tuning test circuit including a transformer and a signal generator in accordance with an exemplary embodiment of the present disclosure.

Referring to FIG. 3, an exemplary schematic of a test circuit 300 is illustrated according to an embodiment. Test circuit 300 includes a transformer 320, such as transformer 110 of FIG. 1, including a primary coil 316 and a secondary coil 318. Test circuit 300 further includes a bridge rectifier 304 and a capacitor bank 306. In one embodiment, transformer 320, bridge rectifier 304, and capacitor bank 306 form at least a portion of transducer 108 of FIG. 1. Transformer 320 includes a first transformer terminal 308, a second transformer terminal 310, a third transformer terminal 312, a fourth transformer terminal 314 corresponding to respective terminals 1 through 4 of FIG. 2. Test circuit 300 further includes a power source or signal generator 302 coupled to the transformer 320 for providing the test signal of the frequency sweep. In one embodiment, signal generator 302 is provided by impedance analyzer 106 of FIG. 1 for executing the frequency sweep of transducer 108. In the illustrated embodiment, signal generator 302 provides a 600 volt, 3 kHz alternating current (AC) signal. In one embodiment, impedance analyzer 106 records the overall impedance of circuit 300 at the frequencies of the frequency sweep. In one embodiment, capacitor bank 306 includes multiple ceramic rings in parallel that hold a voltage potential and are operative to release the voltage potential for sending sound pressure signals and to provide electrical input based on received sound pressure signals.

Signal generator 302 is connected to second transformer terminal 310, while first transformer terminal 308 is connected to one side of capacitor bank 306 and fourth transformer terminal 314 is connected to one side of bridge rectifier 304. Third transformer terminal 312 connects to ground, the other side of bridge rectifier 304, and the other side of capacitor bank 306. In one embodiment, bridge rectifier 304 allows for sending and receiving sound signals by allowing current to flow into and out of transformer 320.

Figure 4:
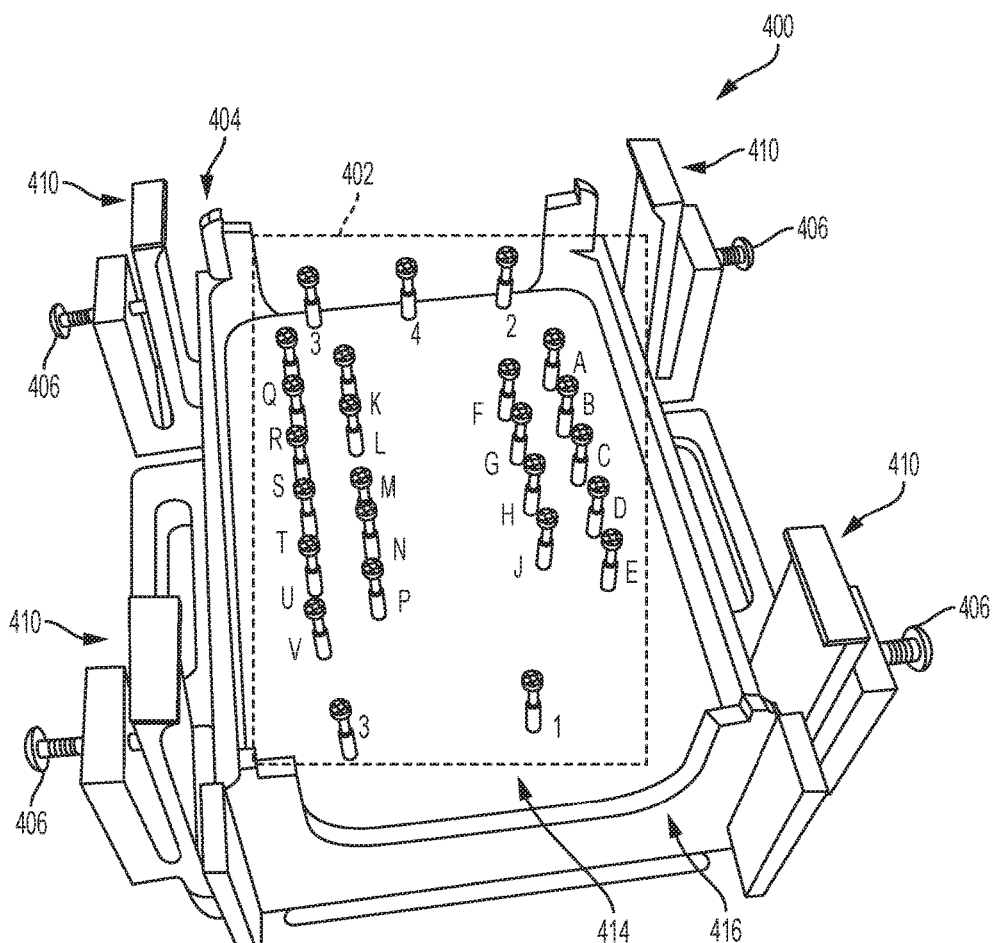
FIG. 4 illustrates a perspective view of a transformer fixture according to an exemplary embodiment of the present disclosure.
Figure 5:
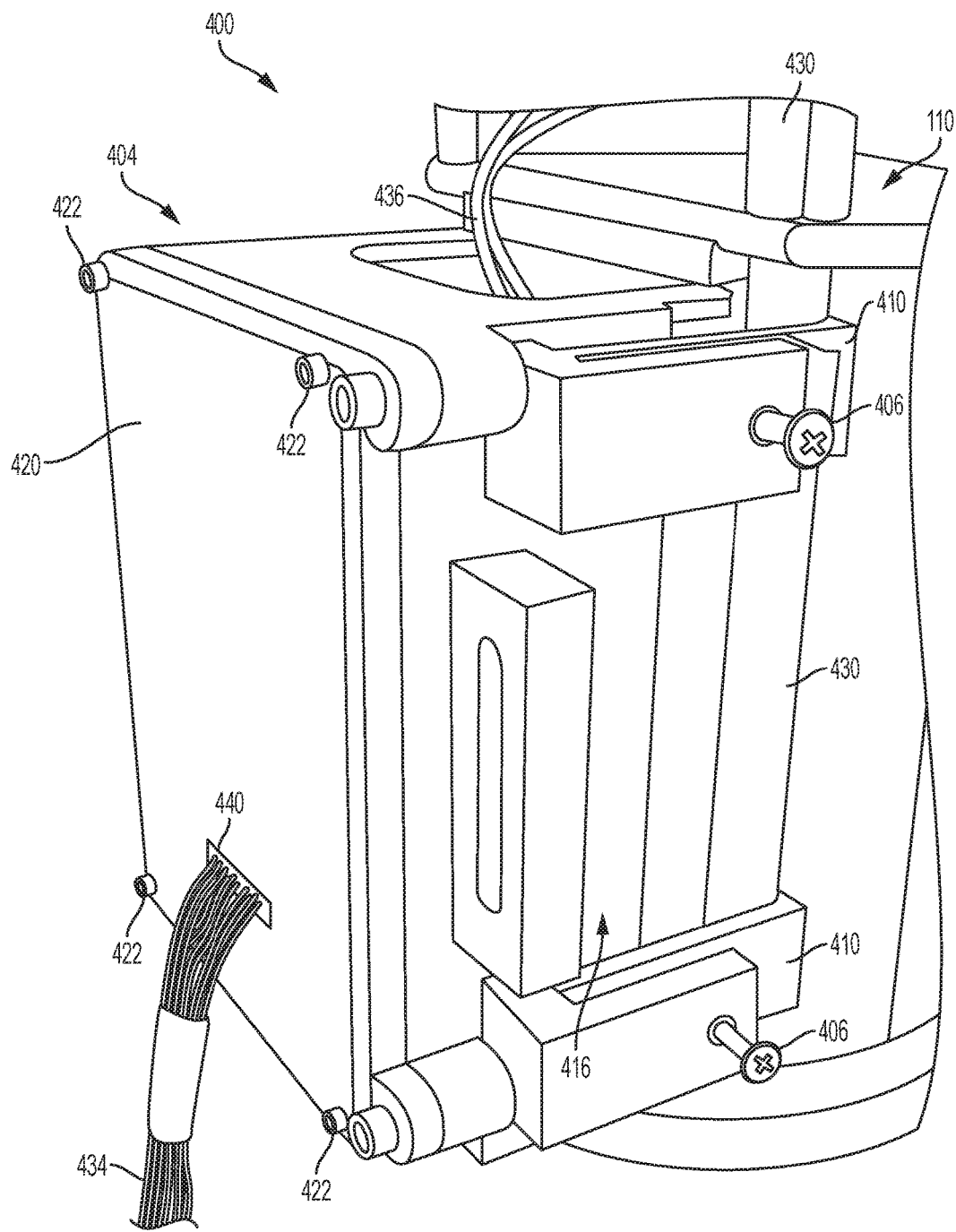
FIG. 5 illustrates a side perspective view of the transformer fixture of FIG. 4 in accordance with an exemplary embodiment of the present disclosure.

An exemplary transformer fixture 140 of FIG. 1 is illustrated in FIGS. 4 and 5 with transformer fixture 400. Transformer fixture 400 mounts to transformer 110 and supports switching network 104 of FIG. 1. Transformer fixture 400 includes a frame 404 and a plurality of connectors or terminals 402 (FIG. 4). In the illustrated embodiment, connectors 402 include springed pins, such as waffle probes, that are arranged to make electrical contact with corresponding transformer terminals 202 and inductor terminals of transformer 110 (FIG. 2) when fixture 400 is mounted to transformer 110. Connectors 402 may include other connector types suitable for engaging terminals of transformer 110. Connectors 402 labeled A through V are configured to engage corresponding inductor terminals labeled A through V (FIG. 2), and connectors 402 labeled 1 through 4 are configured to engage corresponding transformer terminals 202 labeled 1 through 4 (FIG. 2). When fixture 400 is mounted to transformer 110, the springed connectors 402 are compressed by the force of corresponding terminals of transformer 110 to provide an electrical connection therebetween.

Frame 404 of fixture 400 includes a plurality of clamp portions 410 spaced around the perimeter of frame 404. In the illustrated embodiment, four clamp portions 410 are provided, with one at each corner of fixture 400. Clamp portions 410 include flanged ends that engage a corresponding frame 430 (FIG. 5) of transformer 110 for mounting fixture 400 to frame 430. In one embodiment, clamp portions 410 are adapted to flex outwardly and snap onto transformer frame 430 when pushed onto frame 430. Fasteners 406 are tightened to clamp fixture 400 onto transformer frame 430. In one embodiment, frame 404 of fixture 400 is made of plastic or another suitable polymer or nonconductive material. Connectors 402 are illustratively coupled to a nonconductive internal cover 414 that is seated in an interior region formed by a perimeter wall 416 of frame 404. In the illustrated embodiment, wall 416 has a height suitable for biasing connectors 402 at a sufficient distance from transformer 110 such that connectors 402 compress when fixture 400 is mounted to transformer 110.

As illustrated in FIG. 5, fixture 400 includes an outer cover 420 coupled to frame 404 via fasteners 422. Cover 420, which may be plastic or another suitable nonconductive material, includes an opening for routing communication wires or cables 434 from computing device 102 to switching network 104 (FIG. 1) positioned in the interior of fixture 400. Wires 434, which may include wires 148, 152 of FIG. 1, route control, data, and feedback signals between computing device 102 and impedance analyzer 106 and the switching network 104. Cover 420 is removable to access cards 142 (FIG. 1) of switching network 104. Ground wires 436 are illustratively routed from terminals 202 (FIG. 2) of transformer 110 and coupled to ground. A wire connector 440 connects wire bundle 434 to switching network 104 inside fixture 400. In one embodiment, connector 440 includes a general purpose interface bus (GPIB) connector for coupling to switching network 104, although other suitable connectors may be used. Connector 440 may include another suitable type of electrical connector with multiple pins, including a D-sub or USB connector, for example.

Figure 6:
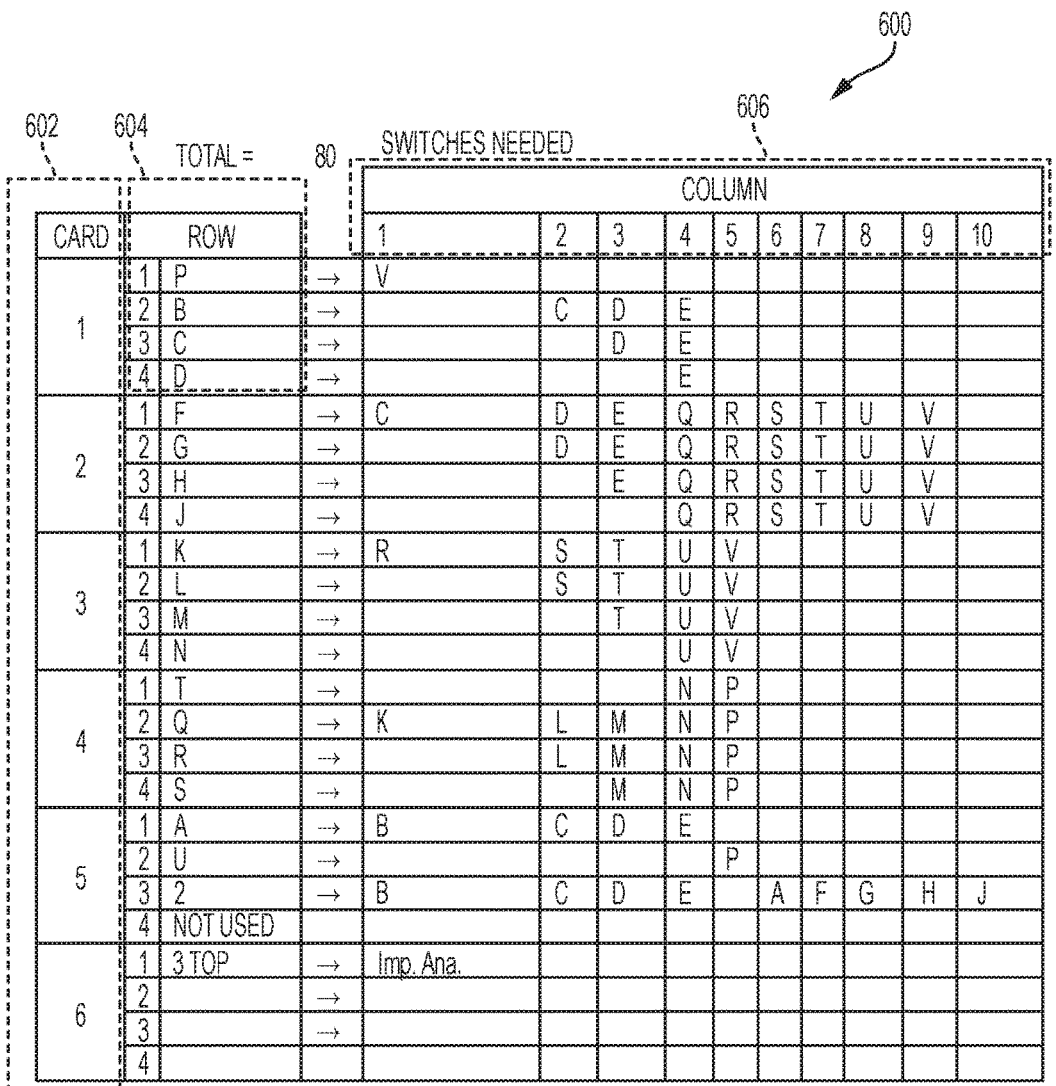
FIG. 6 illustrates a diagram of a switching network matrix in accordance with an exemplary embodiment of the present disclosure.

Referring to FIG. 6, a diagram of an exemplary switching matrix 600 for a switching network 104 (FIG. 1) is illustrated. Data representing switching matrix 600 is stored in memory 122 of computing device 102. Switching matrix 600 illustratively identifies six switching cards 142 in column 602, although any suitable number of cards 142 may be provided in switching network 104. Matrix 600 represents each switching card 142 with four rows 604 and ten columns 606, wherein each position (row X, column Y) in the matrix 600 represents a corresponding switch 144 (FIG. 1) of the corresponding card 142.

As described above, with switching cards 142 of FIG. 1 inserted into fixture 140, switching matrix 600 identifies which terminals of transformer 110 the switches 144 connect to. Computing device 102 connected to switching network 104 opens or closes each switch 144 by communicating data to switching network 104 that represents a card number, row number, and column number. For example, to connect inductor terminal B of transformer 110 to inductor terminal D, computing device 102 instructs switching network 104 to close the switch 144 indicated by card 1, row 2, column 3 of matrix 600. As another example, to connect inductor terminal K to inductor terminal Q, computing device 102 instructs switching network 104 to actuate the switch 144 indicated by card 4, row 2, column 1, thereby adding eight turns to secondary coil 114 (see FIG. 2). In one embodiment, switching network 104 includes 80 switches 144 to provide the connections designated in switching matrix 600, although another suitable number of switches 144 may be provided. In one embodiment, card 6 identified in column 602 of matrix 600 is operative to connect impedance analyzer 106 (FIG. 1) directly to switching network 104 and transformer 110 via a cable connector such that computing device 110 is able to switch connection to transformer 110 on and off.

Figure 7:
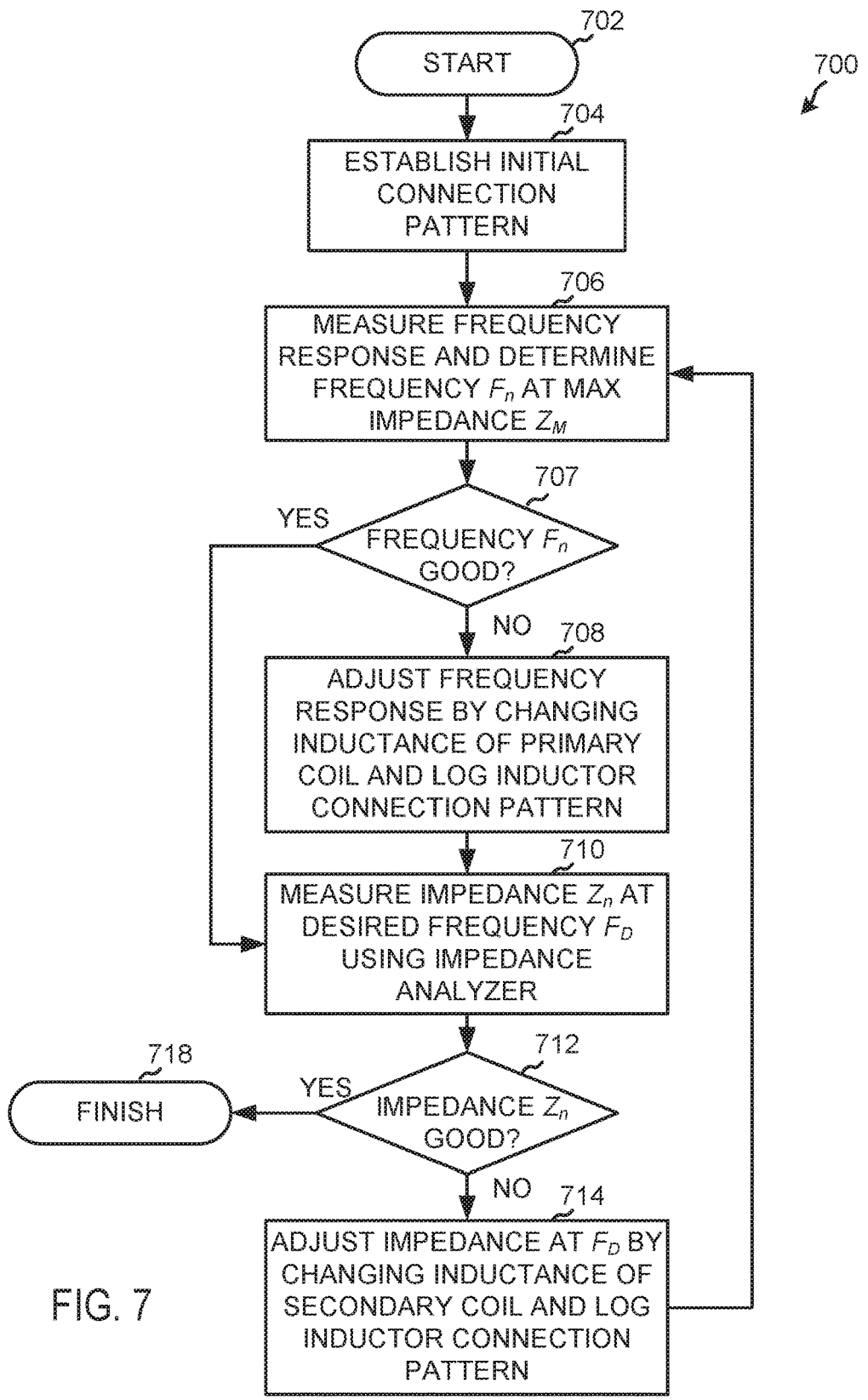
FIG. 7 illustrates a transformer tuning method according to an exemplary embodiment of the present disclosure.
Figure 8:
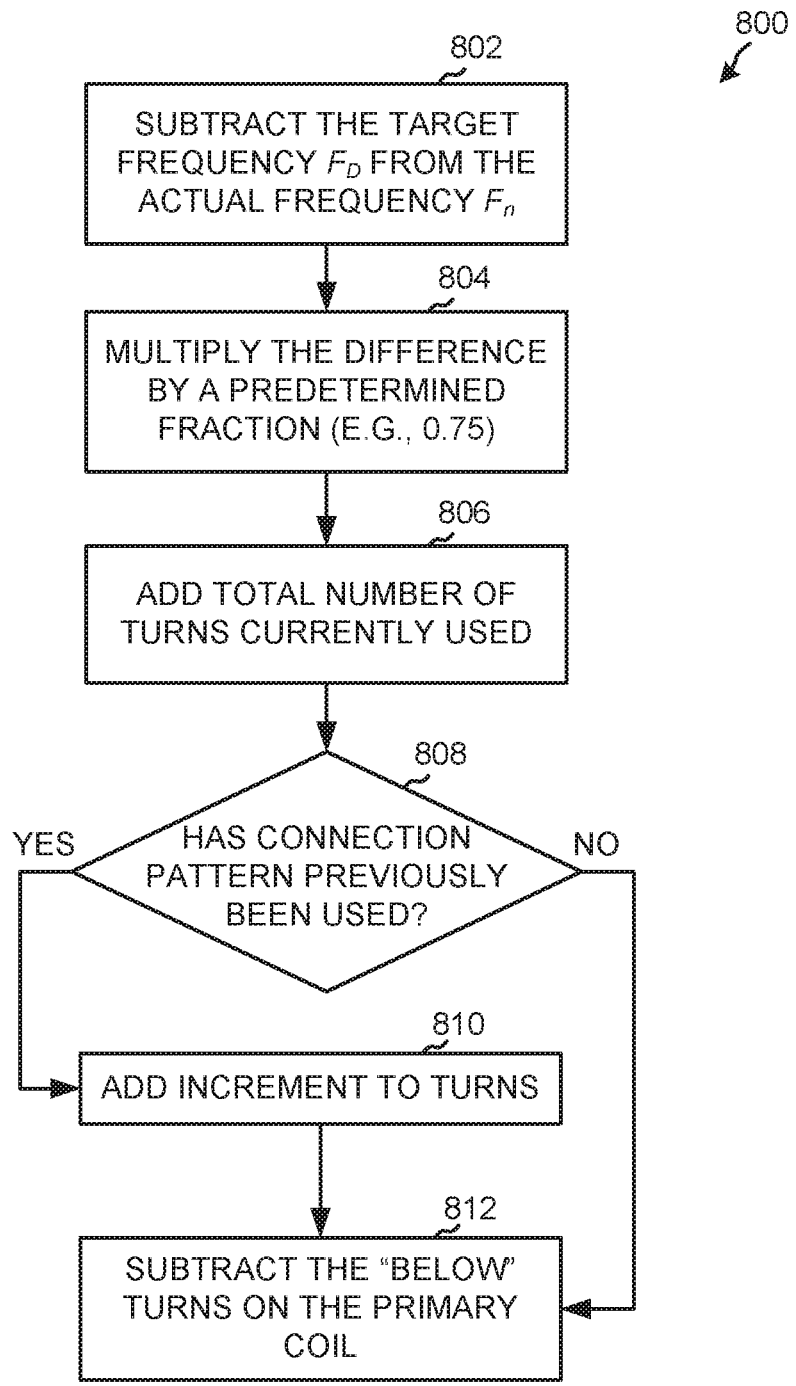
FIG. 8 illustrates a method for calculating a new number of turns on a primary coil of a transformer in accordance with an illustrative embodiment of the present disclosure.
Figure 9:
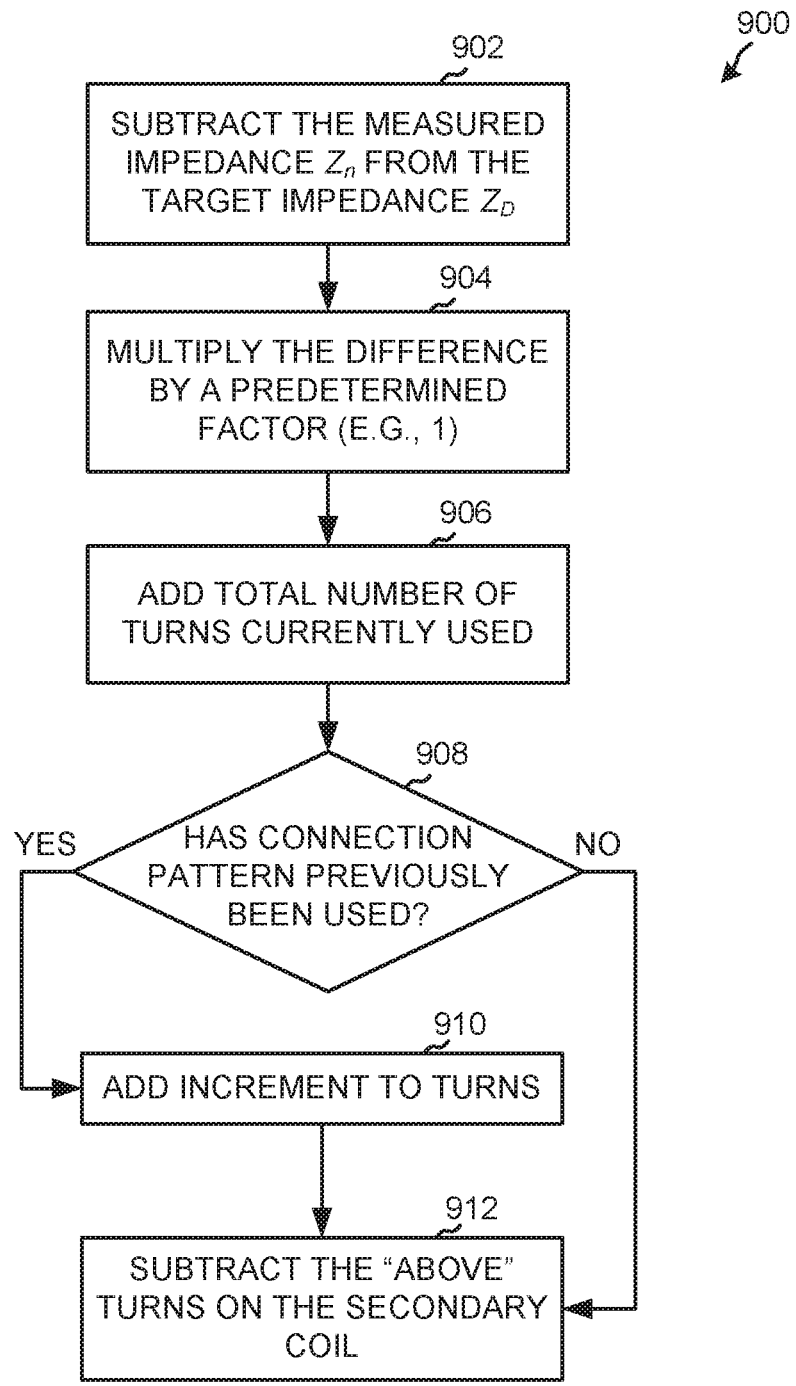
FIG. 9 illustrates a method for calculating a new number of turns on a secondary coil of a transformer according to an illustrative embodiment of the present disclosure.

FIGS. 7-9 illustrate an exemplary method of operation of system 100 of FIG. 1. Reference is made to FIGS. 1-5 throughout the following description of FIGS. 7-9.

Referring to FIG. 7, a transformer tuning method 700 according to an exemplary embodiment is illustrated. At block 702, transformer tuning method 700 is started. For example, after installing fixture 400 (FIG. 4) on transformer 110 and connecting the appropriate cables to switching network 104 and impedance analyzer 106, a user initiates the tuning procedure by providing a start input to computing device 102 (e.g., selecting input 1004 of FIG. 10). At block 704, an initial connection pattern for the inductors of transformer 110 is selected by computing device 102 and implemented via switching network 104. In one embodiment, a default connection pattern is provided by computing device 102 based on an identified type or model of transformer 110. In another embodiment, a user selects the initial connection pattern through a user interface (e.g., user interface 1000 of FIG. 11) prior to starting the tuning procedure. When the initial connection pattern is selected, computing device 102 instructs switching network 104 to adjust the switches 144 according to the pattern to thereby create primary and secondary coils 112, 114 of transformer 110 each having the desired number of turns identified with the initial connection pattern.

At block 706, computing device 102 instructs impedance analyzer 106 to perform a frequency sweep of transformer 110 configured with the initial connection pattern. The frequency response data is provided to or retrieved by computing device 102. Based on the data, computing device 102 determines the frequency $F_1$ ($F_n$ for nth iteration) at which transformer 110 has a maximum input impedance $Z_M$.

At block 707, the frequency $F_1$ at which transformer 110 has a maximum input impedance $Z_M$ is compared to a desired predetermined frequency value or frequency range $F_D$ stored at computing device 102. In the present embodiment, the desired predetermined frequency $F_D$ is 3 kHz, although other suitable frequencies may be used. If the frequency F is approximately equal to the desired frequency $F_D$ (i.e., within the desired range) at block 707, the procedure proceeds to block 710 described below. If the frequency $F_1$ is not approximately equal to the desired frequency $F_D$ (i.e., not within the desired range) at block 707, computing device 102 adjusts the frequency response of transformer 110 at block 708 by controlling switching network 104 to change the number of turns (and thereby inductance) on primary coil 112. In particular, computing device 102 calculates a new number of turns at block 708 (see FIG. 8) and instructs switching network 104 to connect select inductors together to achieve the desired number of turns, as described herein. The resulting connection pattern is stored in memory 122 of computing device 102.

At block 710, after reconfiguring the turns on primary coil 112, computing device 102 instructs impedance analyzer 106 to provide a signal to transformer 110 at the predetermined desired frequency $F_D$ and to measure the transformer impedance $Z_1$ ($Z_n$ for nth iteration) at the desired frequency $F_D$. In one embodiment, the predetermined frequency $F_D$ is 3 kHz, although other suitable values may be used. The measured impedance value $Z_1$ is provided to or retrieved by computing device 102, and at block 712 computing device 102 compares the measured impedance value $Z_1$ to a predetermined desired impedance or impedance range $Z_D$. In one embodiment, the predetermined desired impedance range is 62-70 ohms although other suitable values may be used. If the measured impedance $Z_1$ is sufficiently close to the desired impedance value $Z_D$ (i.e., within the desired range), the process finishes at block 718 until another tuning procedure is initiated by the user.

If the measured impedance $Z_1$ is sufficiently close to the desired impedance value $Z_D$ (i.e., not within the desired range), at block 712, then the process advances to block 714. At block 714, the impedance of transformer 110 is adjusted by changing a number of turns on secondary coil 114. In particular, computing device 102 calculates a new number of turns (see FIG. 9) and instructs switching network 104 to connect various inductors of secondary coil 114 together to achieve the desired number of turns. The resulting connection pattern is stored in memory 122 of computing device 102, and the process returns to block 706. At block 706, impedance analyzer 106 again executes a frequency sweep and measures the frequency response of transformer 110 configured with the new connection pattern, and computing device 102 determines the frequency $F_2$ at which transformer 110 has a maximum input impedance $Z_M$. If the new determined frequency $F_2$ is sufficiently close to the desired frequency $F_D$ at block 707, then the process advances to block 710 to measure the impedance $Z_2$ at the desired frequency $F_D$. If the measured impedance $Z_2$ is sufficiently close to the desired impedance $Z_D$ at block 712, the process has successfully tuned transformer 110 and advances to block 718 where the process finishes. If the measured impedance $Z_2$ is not sufficiently close to the desired impedance $Z_D$ at block 712, then the method proceeds to block 714 to perform another iteration of the method. The tuning method performs n iterations until computing device 102 determines transformer 110 is tuned properly based on the frequency $F_n$ and the measured impedance $Z_n$ being within the respective ranges at blocks 707 and 712.

In one embodiment, computing device 102 instructs the user via user interface 1000 (FIG. 10) that the tuning procedure is complete and identifies the resulting connection pattern. In one embodiment, the user then removes the transformer fixture 140 (FIG. 1) from transformer 110 and configures the inductors of transformer 110 according to the resulting connection pattern provided with computing device 102. For example, the user hardwires and/or solders the inductors of each coil 112, 114 of transformer 110 according to the resulting connection pattern.

Referring to FIG. 8, an exemplary method 800 for calculating a new number of turns on primary coil 112 of transformer 110 (block 708 of FIG. 7) is illustrated. At block 802, computing device 102 subtracts the target frequency $F_D$ from the actual frequency $F_n$. At block 804, computing device 102 multiplies the difference from block 802 by a multiplier, illustratively a fraction. In the present embodiment, the multiplier is 0.75, although other suitable multipliers may be provided based on the desired amount of adjustment each iteration. At block 806, computing device 102 adds the current total number of turns of transformer 110 (primary and secondary coils 112, 114) to the result of block 804. At block 808, computing device 102 compares the currently used inductor connection pattern to the connection patterns that were previously used and stored in computing device 102 during the current tuning procedure (see FIG. 7). If the current connection pattern has not been previously used at block 808, the method proceeds to block 812. If the current connection pattern has been previously used, then computing device 102 proceeds to block 810 to add an incremental number of turns to primary coil 112. In one embodiment, eight turns are added to the result of block 806, although other suitable increments may be used depending on available inductors of primary coil 112 and the size of primary coil 112. At block 812, computing device 102 subtracts the number of "below" turns, or the turns on the primary coil 112, from the result of block 810 (or block 808 if block 810 is skipped). The result of block 812 is the new number of turns on primary coil 112 implemented at block 708 of FIG. 7. Other suitable methods for determining the adjustment to the number of primary coil turns may be provided.

In some embodiments, the multiplier in block 804 may be adjusted. A larger multiplier results in a larger change to the number of turns each iteration while a smaller multiplier results in a more gradual change to the number of turns each iteration. In one embodiment, the number of turns incremented at block 810 is set to the number of turns of the smallest available inductor of primary coil 112. In one embodiment, the number of turns incremented at block 810 is set to a larger number in circuits where eight turns results in an insignificant change in primary coil inductance. Similarly, the number of turns incremented at block 810 is set to a smaller number in circuits where eight turns results in too significant of a change in primary coil inductance. In an alternative embodiment, the turns increment in block 810 may be subtracted rather than added.

Referring to FIG. 9, an exemplary method 900 for calculating a new number of turns on secondary coil 114 of transformer 110 (block 714 of FIG. 7) is illustrated. At block 902, computing device 102 subtracts the measured impedance $Z_n$ from the target impedance $Z_D$. At block 904, computing device 102 optionally multiplies the result of block 902 by a multiplier. In the illustrated embodiment, the multiplier is one, although other suitable multipliers may be used based on the desired amount of adjustment each iteration. At block 906, computing device 102 adds the total number of turns of transformer 110 (primary and secondary coils 112, 114) currently being used to the result of block 904. At block 908, computing device 102 compares the currently used connection pattern to the connection patterns that were previously used and stored in computing device 102 during the current tuning procedure (see FIG. 7). If the connection pattern has not been previously used at block 908, the method proceeds to block 912. If the current connection pattern has been previously used, then computing device 102 proceeds to block 910 to add an incremental number of turns to secondary coil 114. In one embodiment, five turns are added to the result of block 906, although other suitable increments may be used depending on available inductors of secondary coil 114 and the size of secondary coil 114. At block 912, computing device 102 subtracts the number of "above" turns, or the turns currently on secondary coil 112, from the result of block 910 (or block 908 if 910 is skipped). The result of block 912 is the new number of turns on secondary coil 114 implemented at block 714 of FIG. 7. Other suitable methods for determining the adjustment to the number of secondary coil turns may be provided.

In some embodiments, the multiplier in block 904 may be adjusted. A larger multiplier results in a larger change to the number of turns each iteration while a smaller multiplier results in a more gradual change to the number of turns each iteration. In one embodiment, the number of turns incremented at block 910 is set to the number of turns of the smallest available inductor of secondary coil 114. In one embodiment, the number of turns incremented at block 910 is set to a larger number in circuits where five turns results in an insignificant change in secondary coil inductance. In one embodiment, the number of turns incremented at block 810 is set to a smaller number in circuits where five turns results in too significant of a change in secondary coil inductance. In an alternative embodiment, the turns increment in block 910 may be subtracted rather than added.

Figure 10:
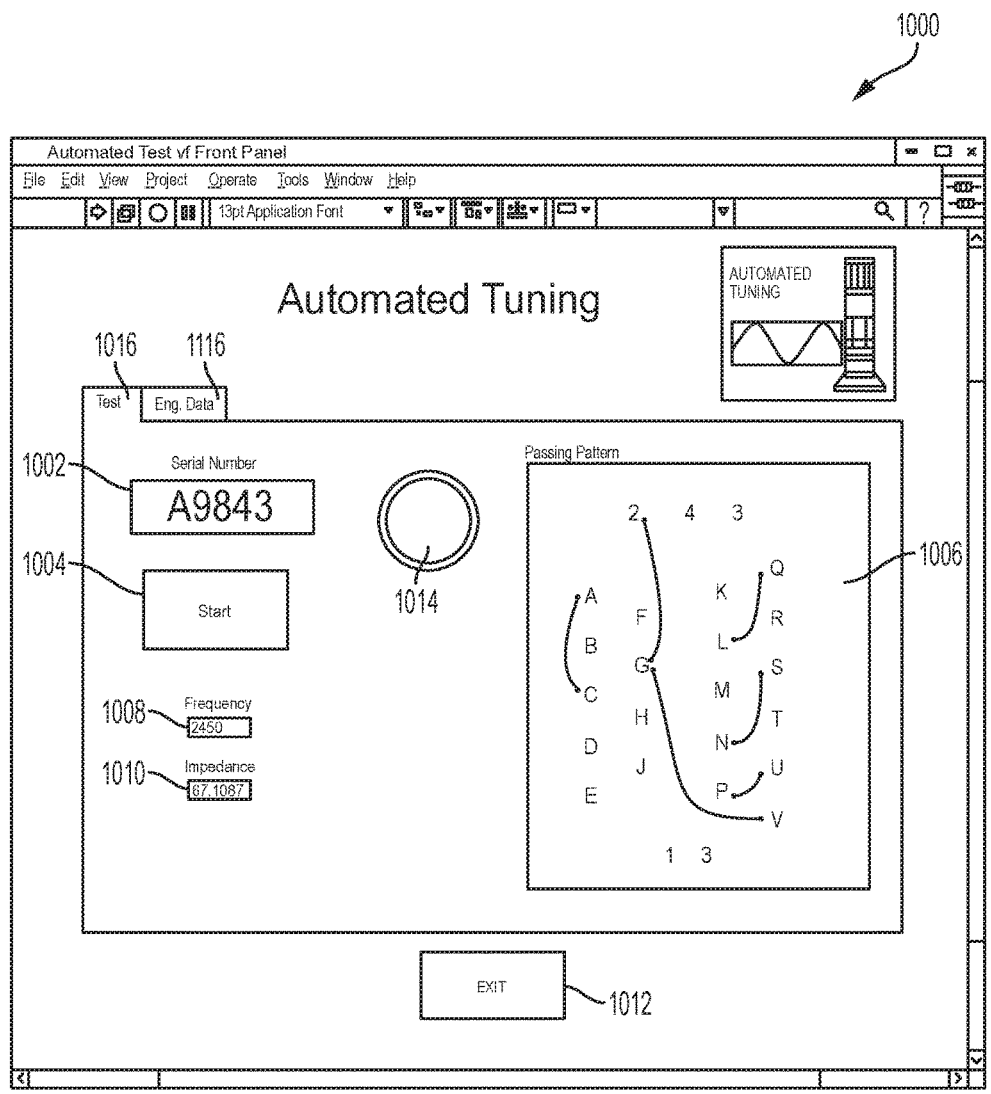
FIG. 10 illustrates a graphical user interface provided by a computing device of the transformer tuning system of FIG. 1 according to an illustrative embodiment of the present disclosure, the graphical user interface displaying a test tab.
Figure 11:
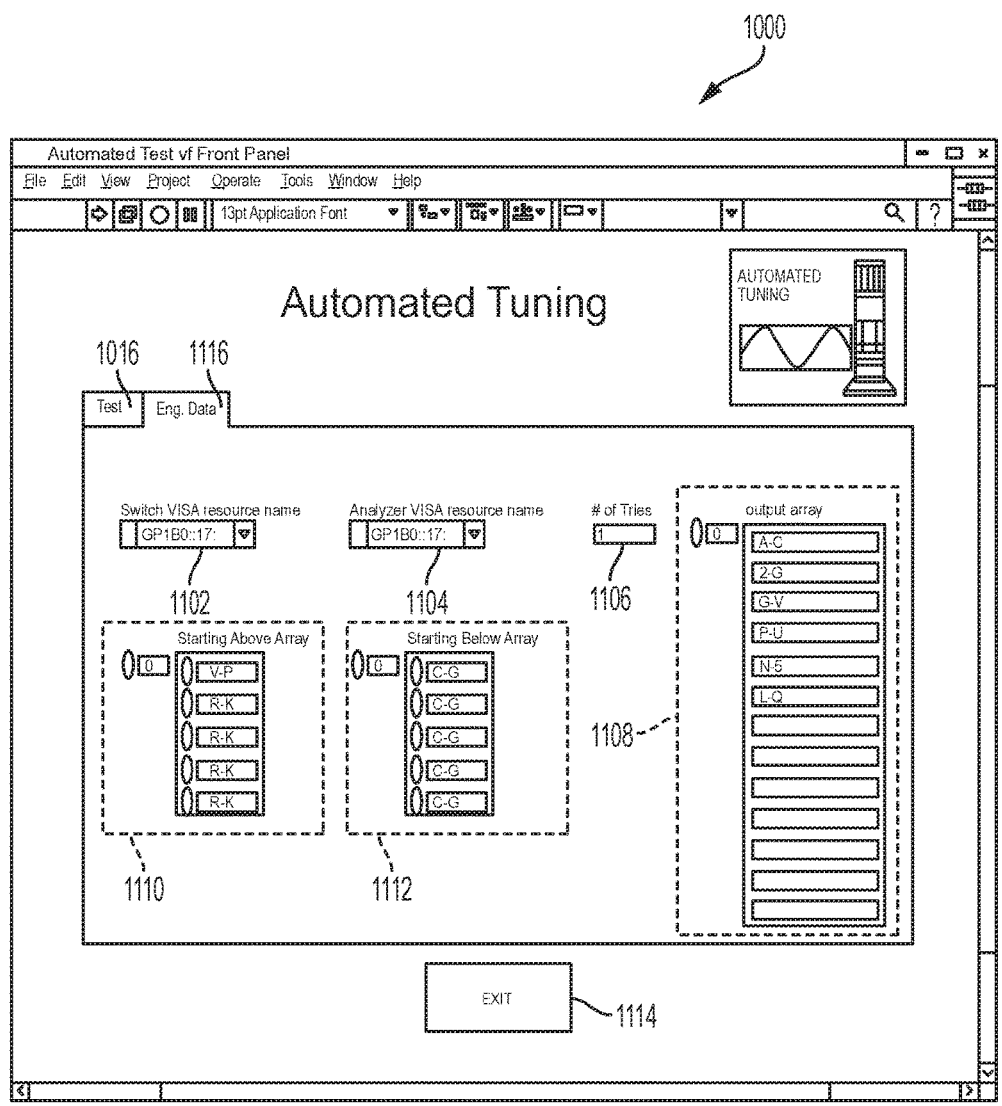
FIG. 11 illustrates the graphical user interface of FIG. 10 displaying an engineering data tab according to an illustrative embodiment of the present disclosure.

Referring to FIGS. 10 and 11, a testing graphical user interface (GUI) 1000 of transformer tuning system 100 of FIG. 1 is illustrated according to some embodiments. In one embodiment, GUI 1000 is provided by computing device 102 on display 118 of FIG. 1. A user provides user input to GUI 1000 via any suitable user input device coupled to computing device 102, such as a touchscreen, keyboard, pointing device (e.g., mouse), etc. In the illustrated embodiment, testing GUI 1000 includes a test tab 1016 and an engineering data tab 1116.

GUI 1000 includes selectable data, such as selectable inputs, fields, modules, tabs, drop-down menus, boxes, and other suitable selectable data, that are linked to and provide input to the components of system 100 of FIG. 1. In one embodiment, the selectable data of GUI 1000 is rendered in a manner that allows it to be individually selectable. For example, the selectable data is selected by a user with a mouse pointer, by touching a touchscreen of the user interface, by pressing keys of a keyboard, or by any other suitable selection mechanism. GUI 1000 further displays monitored data, including status and other feedback data, provided from components of system 100 that is displayed with the selectable data.

Referring to FIG. 10, test tab 1016 illustratively includes a serial number input field 1002, a start button 1004, a testing pattern window 1006, a frequency output 1008, an impedance output 1010, an exit button 1012, and a running indicator 1014. Field 1002 allows a user to enter the serial or identification number of the transformer 110 (or transducer 108) to be tested. In one embodiment, the initial connection pattern of coils 112, 114 identified at block 704 of FIG. 7 is determined by computing device 102 based on the serial number entered in field 1002. A user selects start input 1004 to initiate the tuning procedure after fixture 400 is coupled to transformer 110, system cables are connected, and components are powered on by the user. Status indicator 1014 displays a color (e.g., green or red) corresponding to whether the tuning procedure is running, stopped, or completed. Selection of exit button 1012 allows a user to interrupt the tuning procedure and/or to exit the program. Field 1008 displays the input frequency $F_n$ (illustratively in Hertz) that results in the maximum input impedance $Z_M$ (block 706 of FIG. 7) following the tuning procedure. Field 1010 displays the impedance $Z_n$ (illustratively in ohms) of transformer 110 at the predetermined desired frequency $F_D$ (block 710 of FIG. 7) following completion of the tuning procedure.

Window 1006 displays a visualization of the connection pattern of the primary and secondary coils 112, 114 that results from the tuning procedure. As illustrated, the visualization shows which inductors of FIG. 2 have been connected to each other to achieve the resulting frequency and impedance values displayed in respective fields 1008 and 1010. In one embodiment, window 1006 further displays the real-time current connection pattern of transformer 110 provided with switching network 104 as the tuning procedure steps through each tested pattern while searching for the connection pattern that passes the test.

Referring to FIG. 11, engineering data tab 1116 of GUI 1000 is selected. Engineering data tab 1116 includes a switching network connector selection 1102, an impedance analyzer connector selection 1104, a counter output 1106, an output array 1108, a starting secondary array 1110, a starting primary array 1112, and an exit button 1114.

Switching network connector selection 1102 allows a user to select which pin or pins of a connector to use as output from computing device 102 to switching network 104 for controlling switching network 104. In one embodiment, switching network 104 is connected to computing device 102 by a GPIB connector. Impedance analyzer connector selection 1104 allows a user to select which pin or pins of a connector to use as input to computing device 102 from impedance analyzer 106. In one embodiment, impedance analyzer 106 is connected to computing device 102 by a GPIB connector. For example, impedance analyzer connector selection 1104 allows the user to select from a dropdown menu which pin of the GPIB connector computing device 102 will use to receive data from impedance analyzer 106. For example, the pins identified with respective selections 1102, 1104 may be based on the model or type of switching cards 142 of switching network 104 or impedance analyzer 106 (FIG. 1).

Counter 1106 of FIG. 11 displays the number of connection patterns that have been tested while running the tuning procedure of FIG. 7. Output array 1108 displays a table version of the current connection pattern being tested. The letters correspond to inductor terminals and the numbers correspond to transformer terminals, as described herein with respect to FIG. 2. Starting secondary array 1110 allows a user to set the starting (initial) connection pattern for secondary coil 114, and starting primary array 1112 allows a user to set the starting (initial) connection pattern for primary coil 112 (e.g., see block 704 of FIG. 7). When initiating the transformer tuning process, computing device 102 communicates data to switching network 104 causing switching network 104 to close the appropriate switches 144 corresponding to the initial connection patterns identified in arrays 1110 and 1112. Exit button 1114 allows a user to interrupt the testing process and/or exit the program.

Figure 12:
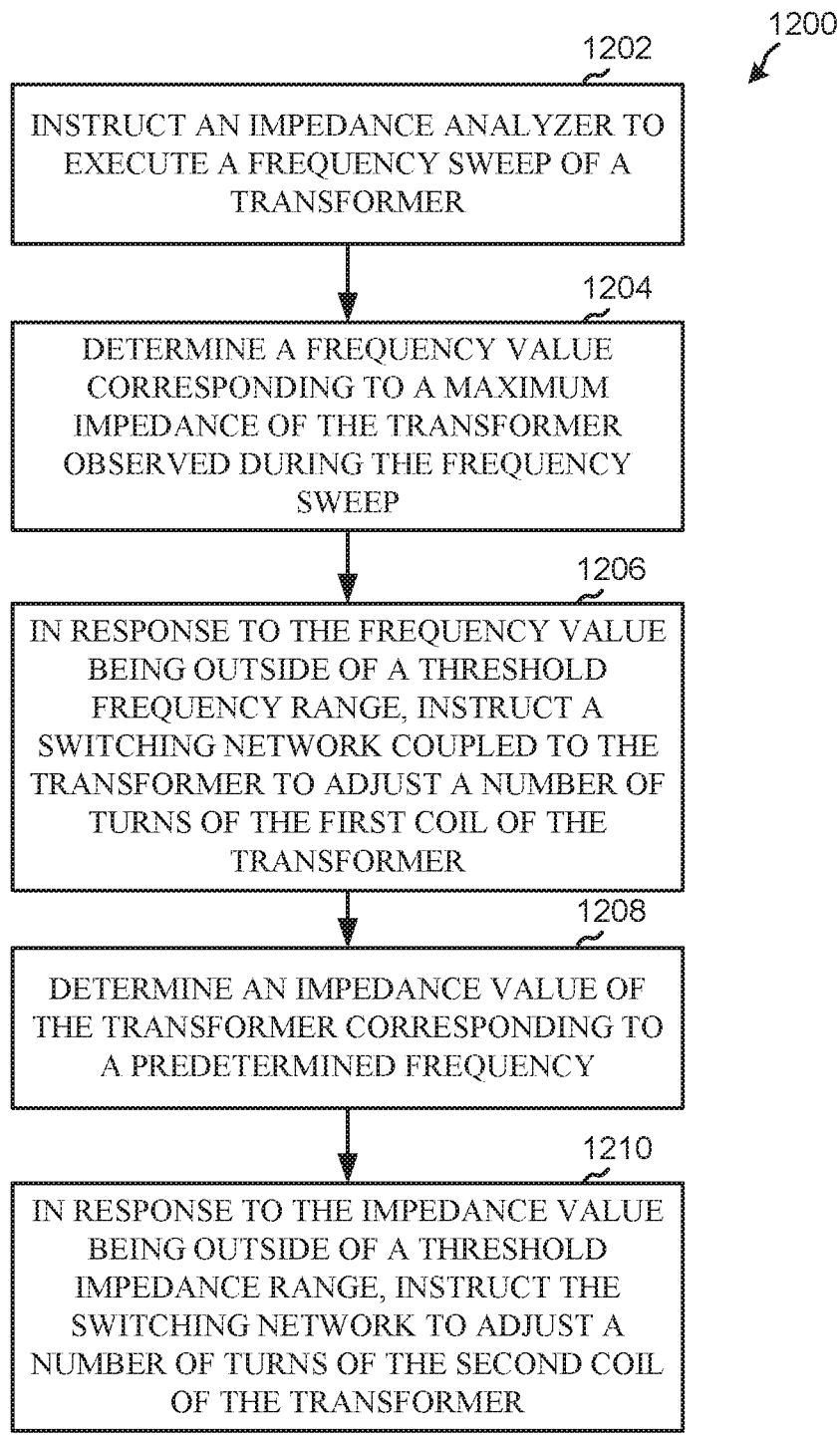
FIG. 12 illustrates an exemplary method of operation by transformer tuning logic of the computing device of FIG. 1 for performing a transformer tuning procedure.

FIG. 12 illustrates an exemplary method of operation performed by computing device 102, and in particular by transformer tuning logic 124 (FIG. 1), for performing a tuning procedure for transformer 110. Reference is made to FIGS. 1-5 throughout the following description of FIG. 12. At block 1202, tuning logic 124 instructs impedance analyzer 106 to execute a frequency sweep of transformer 110. At block 1204, tuning logic 124 determines a frequency value corresponding to a maximum impedance of transformer 110 observed during the frequency sweep. At block 1206, in response to the frequency value being outside of a threshold frequency range, tuning logic 124 instructs switching network 104 coupled transformer 110 to adjust a number of turns of a first coil (e.g., primary coil 112) of transformer 110. At block 1208, tuning logic 124 determines an impedance value of transformer 110 corresponding to a predetermined frequency (e.g., frequency $F_D$). In one embodiment, the impedance value is determined following adjustment of the number of turns of the first coil by switching network 104. At block 1210, in response to the impedance value being outside of a threshold impedance range, tuning logic 124 instructs switching network 104 to adjust a number of turns of a second coil (e.g., secondary coil 114) of transformer 110.

In one embodiment, tuning logic 124 further instructs impedance analyzer 106, following adjustment of the number of turns of the first coil by switching network 104, to provide a test signal to transformer 110 at the predetermined frequency and to monitor the impedance of transformer 110 at the predetermined frequency. In one embodiment, tuning logic 124 calculates a target number of turns of the first coil and determines a connection pattern of a plurality of inductors of the first coil. The connection pattern identifies which inductors of the first coil to connect to at least one terminal 202 (FIG. 2) of transformer 110 to achieve the target number of turns. In one embodiment, tuning logic 124 determines, following a second frequency sweep by impedance analyzer 106, a second impedance value of transformer 110 corresponding to the predetermined frequency. Tuning logic 124 instructs switching network 104 to adjust the number of turns on the second coil in response to the second impedance value being outside of the threshold impedance range. In one embodiment, tuning logic 124 instructs switching network 104 by communicating switch commands to switching network 104 based on the connection pattern.

In one embodiment, prior to installing fixture 400 (FIG. 3) on transformer 110 and performing the tuning procedure, inductors of transformer 110 are decoupled from each other (e.g., wiring or soldering connections removed) such that transformer 110 has the base inductor configuration illustrated in FIG. 2. In one embodiment, once the connection pattern is determined by computing device 102 following the tuning procedure, a technician removes the fixture 400 (FIG. 4) and switching network 104 (FIG. 1) from transformer 110 and hardwires and/or solders the inductors of transformer 110 according to the connection pattern. As such, the tuning system 100 may then be coupled to another transformer 110 for testing. In one embodiment, tuning system 100 includes multiple fixtures, switching networks, and impedance analyzers coupled to computing device 102 for testing and tuning multiple transformers 110 simultaneously or in series.

In one embodiment, transducer 108 of FIG. 1 is a Tonpilz transducer 108. Tonpilz transducer 108 is operative to send and receive signals for detecting a distance to an object. In one embodiment, Tonpilz transducer 108 is mounted near a hull of a ship and is configured to communicate sonar signals underwater to detect a distance to other objects in the water. Tonpilz transducer 108 and transformer 110 of FIG. 1 may be implemented in other suitable environments.

The term "logic" or "control logic" as used herein may include software and/or firmware executing on one or more programmable processors, application-specific integrated circuits (ASICs), field-programmable gate arrays (FPGAs), digital signal processors (DSPs), hardwired logic, or combinations thereof. Therefore, in accordance with the embodiments, various logic may be implemented in any appropriate fashion and would remain in accordance with the embodiments herein disclosed.

The disclosed operations set forth herein may be carried out by one or more suitable processors that are in communication with non-transitory computer readable medium such as but not limited to CDROM, RAM, other forms of ROM, hard drives, distributed memory, etc. The non-transitory computer readable medium stores executable instructions that when executed by the one or more processors cause the one or more processors to perform, for example, the operations of computing device 102 and impedance analyzer 106 described herein and/or the methods as described with reference to FIGS. 7-9 and 12.

While the embodiments have been described as having preferred designs, the disclosed embodiments can be further modified within the spirit and scope of this disclosure. This application is therefore intended to cover any variations, uses, or adaptations of the embodiments using its general principles. Further, this application is intended to cover such departures from the present disclosure as come within known or customary practice in the art to which this disclosure pertains and which fall within the limits of the appended claims.

The invention claimed is:

1. A transformer tuning system comprising:
   a fixture removably coupled to a transformer, the fixture including a plurality of electrical connectors configured to engage a plurality of inductors of the transformer when the fixture is coupled to the transformer;
   an impedance analyzer in communication with the transformer, the impedance analyzer being operative to execute a frequency sweep of the transformer and to monitor a frequency response of the transformer based on the frequency sweep;
   a switching network coupled to the fixture and including a plurality of electrical switches in electrical communication with the plurality of electrical connectors of the fixture, the switching network being operative to selectively open and close the plurality of electrical switches to selectively connect at least one inductor of the plurality of inductors of the transformer to at least one terminal of the transformer; and
   at least one computing device in communication with the impedance analyzer and the switching network, the at least one computing device being operative to
   determine at least one of a frequency value and an impedance value of the transformer following the frequency sweep, the frequency value corresponding to a maximum impedance of the transformer observed during the frequency sweep, the impedance value corresponding to a predetermined frequency applied to the transformer, and
   instruct the switching network to adjust a number of turns of at least one of a first coil and a second coil of the transformer based on the at least one of the frequency value and the impedance value of the transformer.

2. The system of claim 1, wherein the at least one computing device is operative to
   calculate a target number of turns of the at least one of the first coil and the second coil of the transformer, and
   determine a connection pattern of the plurality of inductors of the transformer that identifies which inductors to connect to the at least one terminal of the transformer to achieve the target number of turns.

3. The system of claim 1, wherein the at least one computing device is operative to determine the impedance value corresponding to the predetermined frequency in response to the number of turns of the at least one of the first coil and the second coil being adjusted by the switching network.

4. The system of claim 1, wherein the switching network includes a plurality of cards removably coupled to the fixture, and the plurality of cards include the plurality of electrical switches.

5. A non-transitory computer-readable medium comprising:
   executable instructions such that when executed by at least one processor cause the at least one processor to:
   instruct an impedance analyzer to execute a frequency sweep of a transformer;
   determine a frequency value corresponding to a maximum impedance of the transformer observed during the frequency sweep;
   in response to the frequency value being outside of a threshold frequency range, instruct a switching network coupled to the transformer to adjust a number of turns of a first coil of the transformer;
   determine an impedance value of the transformer corresponding to a predetermined frequency; and
   in response to the impedance value being outside of a threshold impedance range, instruct the switching network to adjust a number of turns of a second coil of the transformer.

6. The non-transitory computer-readable medium of claim 5, wherein the impedance value is determined in response to the number of turns of the first coil of the transformer being adjusted by the switching network.

* * * * *